United States Patent
Kim

(10) Patent No.: US 10,134,716 B2
(45) Date of Patent: Nov. 20, 2018

(54) MULTI-PACKAGE INTEGRATED CIRCUIT ASSEMBLY WITH THROUGH-MOLD VIA

(71) Applicant: Intel Corporation, Santa Clara, CA (US)

(72) Inventor: Hyoung Il Kim, Folsom, CA (US)

(73) Assignee: Intel Corporatin, Santa Clara, CA (US)

( * ) Notice: Subject to any disclaimer, the term of this patent is extended or adjusted under 35 U.S.C. 154(b) by 0 days.

(21) Appl. No.: 15/460,982

(22) Filed: Mar. 16, 2017

(65) Prior Publication Data

US 2018/0269187 A1    Sep. 20, 2018

(51) Int. Cl.
  *H01L 25/10* (2006.01)
  *H01L 25/00* (2006.01)

(52) U.S. Cl.
  CPC ............ *H01L 25/105* (2013.01); *H01L 25/50* (2013.01); *H01L 2225/1041* (2013.01); *H01L 2225/1058* (2013.01)

(58) Field of Classification Search
  CPC .................. H01L 25/105; H01L 25/50; H01L 2225/1041
  See application file for complete search history.

(56) References Cited

U.S. PATENT DOCUMENTS

| | | | |
|---|---|---|---|
| 2014/0217604 A1* | 8/2014 | Chou | H01L 24/11 257/774 |
| 2015/0228621 A1* | 8/2015 | Kumar | H01L 25/0657 257/777 |

* cited by examiner

*Primary Examiner* — Errol Fernandes
(74) *Attorney, Agent, or Firm* — Schwegan Lundberg & Woessner, P.A.

(57) ABSTRACT

A multi-package integrated circuit assembly can include a first electronic package having a first package substrate including a first die side and a first interface side. A first die can be electrically coupled to the first die side. A second electronic package can include a second package substrate having a second die side and a second interface side. A second die can be electrically coupled to the second die side. A metallic plated hole can be electrically coupled from the interface side of the first package substrate to the interface side of the second package substrate. A collective substrate can be attached to the first electronic package. For instance, the collective substrate can be located on a face of the first electronic package opposing the first package substrate. The collective substrate is electrically coupled to the first die and the second die through the first package substrate.

13 Claims, 6 Drawing Sheets

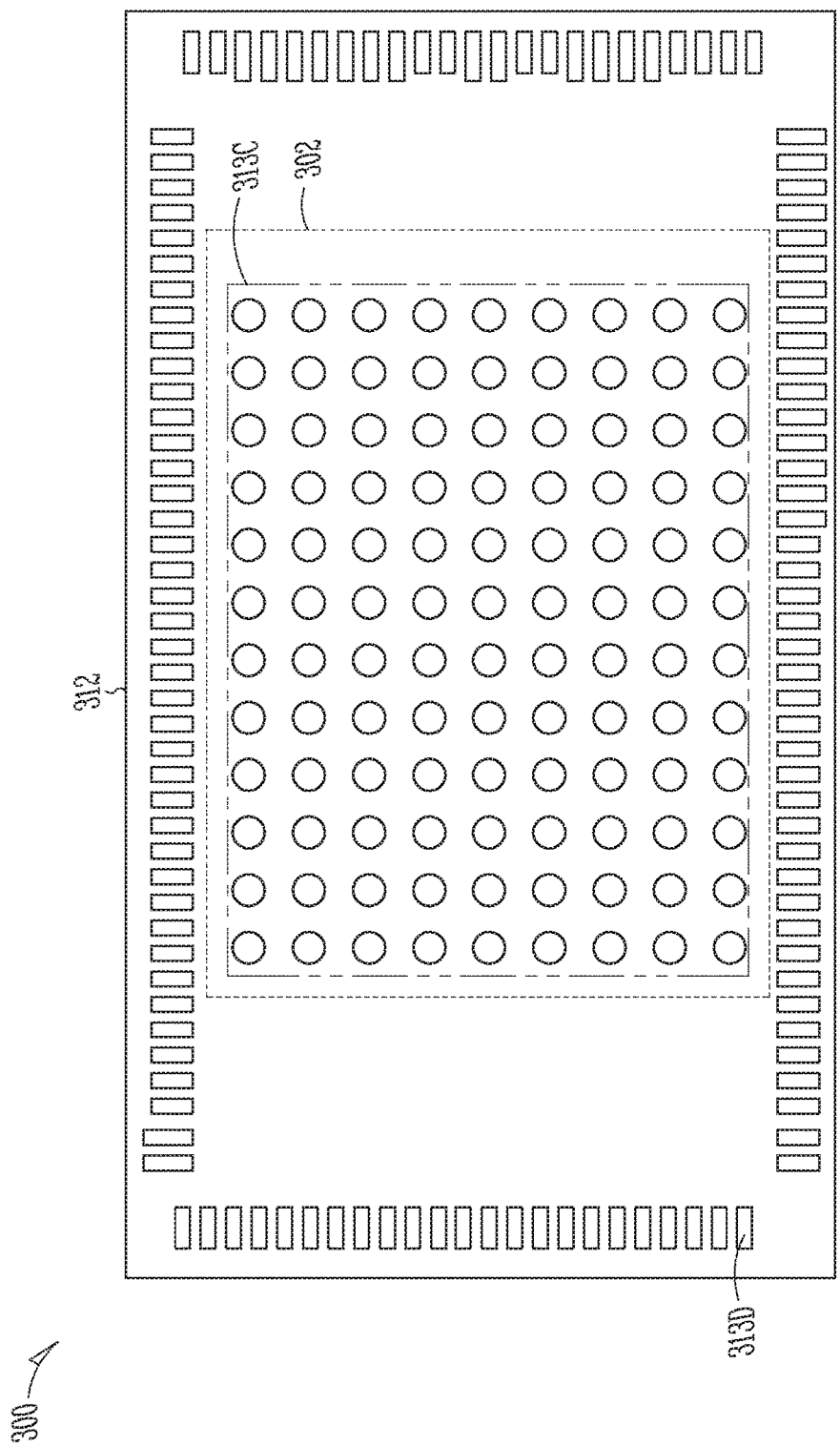

MULTI-PACKAGE INTEGRATED CIRCUIT ASSEMBLY WITH THROUGH-MOLD VIA

TECHNICAL FIELD

This document pertains generally, but not by way of limitation, to integrated circuit assemblies, such as integrated circuit assemblies including multiple electronic packages.

BACKGROUND

Integrated circuit assemblies, such as integrated circuit assemblies including two or more electronic packages, can be used for logic processing or memory storage. Electronic packages can include one or more dies, such as silicon dies. For instance, integrated circuit assemblies can be used in personal computers, servers, game counsels, internet-of-things devices, and other electronic devices. Datacenter and server markets seek integrated circuit assemblies with higher performance and compact size. With increasing computing demand, integrated circuit assemblies often include multiple dies. For instance, integrated circuit assemblies can include several electronic packages communicatively coupled together. Often, the electronic packages can be stacked to reduce the amount of board space used to couple the integrated circuit assembly to a printed circuit board or substrate of the circuit package. In a further example, a plurality of dies can be stacked on one another within the integrated circuit assembly to provide more processing and memory capacity.

Electrical connections between stacked electronic packages are often located alongside the lower die, for instance, around the perimeter of the lower die. The electrical pads of the upper electronic package and lower electronic package can be specially configured for the stacked arrangement. For instance, the contacts of the upper electronic package may be arranged in an area corresponding to locations around the exterior perimeter of the upper die. Accordingly, a substrate of the upper or lower electronic package can include dimensions larger enough to accommodate the die foot print and the electrical connections. In some instances, the cost of defects in the manufactured electronic package can increase as the number of dies or electronic packages increase. For example, warpage between dies or electronic packages can result in difficulties in forming electrical connections between the various dies and electronic packages. There is a general need for devices, systems and methods to address the requirements for integrated circuit assemblies with increased performance and small size, while at the same time reducing yield losses.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 3 illustrates an example of a top view of a substrate of a multi-package integrated circuit assembly, according to an embodiment.

DETAILED DESCRIPTION

Figure 1:
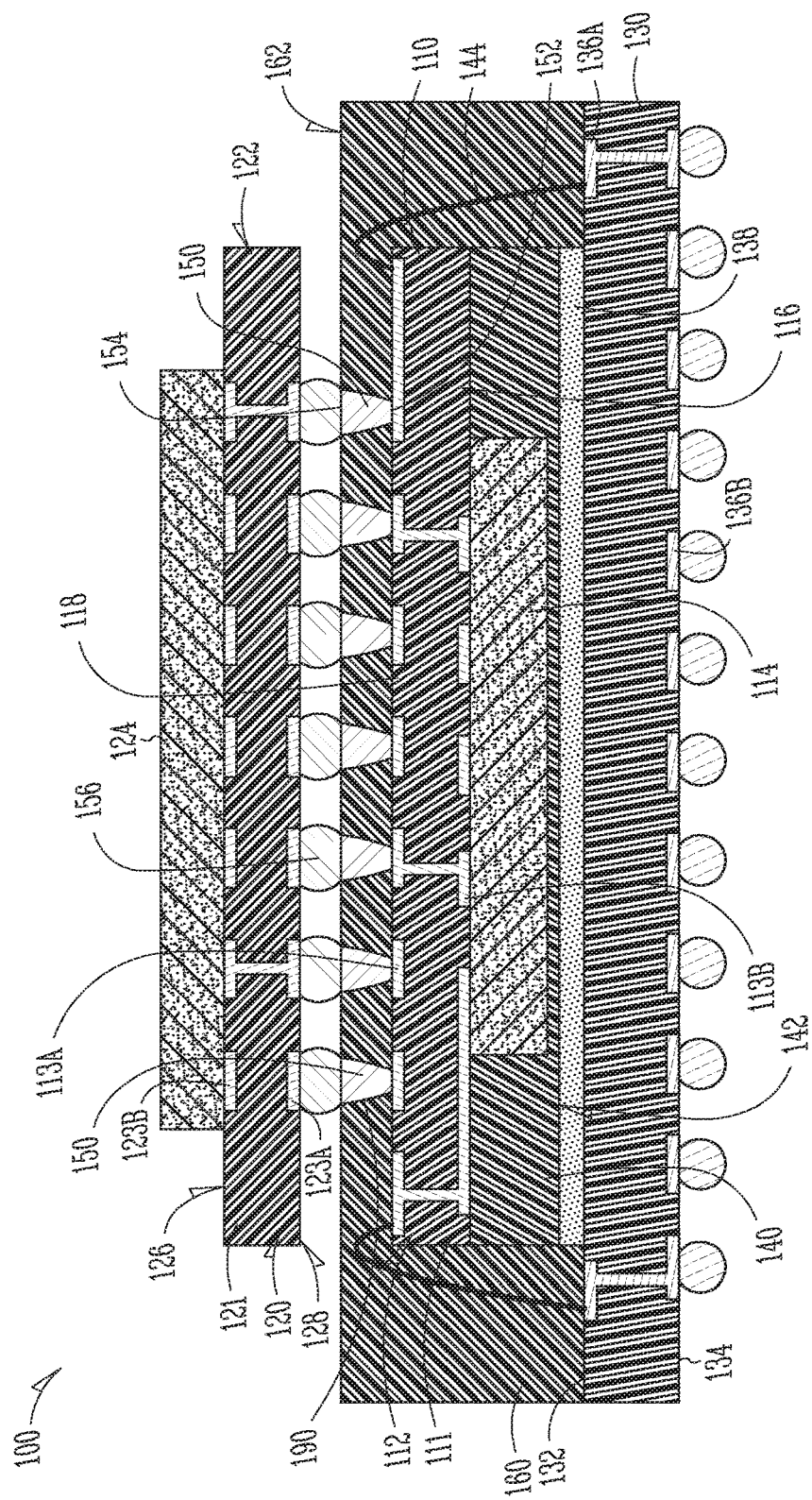
FIG. 1 illustrates an example of a multi-package integrated circuit assembly, according to an embodiment.

The present application relates to devices and techniques for a multi-package integrated circuit assembly, such as a multi-package integrated circuit assembly including a first electronic package electrically coupled to a second electronic package by a metallic plated hole. The metallic plated hole can be located between a first substrate of the first electronic package and a second substrate of the second electronic package, where the first and second substrates are located between a first die of the first electronic package and a second die of the second electronic package. The following detailed description and examples are illustrative of the subject matter disclosed herein; however, the subject matter disclosed is not limited to the following description and examples provided. Portions and features of some embodiments may be included in, or substituted for, those of other embodiments. Embodiments set forth in the claims encompass all available equivalents of those claims.

The present inventors have recognized, among other things, that a problem to be solved can include increasing the number of dies within an integrated circuit assembly while reducing size and mitigating manufacturing defects. Integrated circuit assemblies often include a plurality of dies within a single electronic package. For instance, an electronic package can include a plurality of stacked silicon dies (e.g., a three-dimensional package). As the number of dies stacked together increases, yield loss of electronic packages can increase accordingly. Often, the electronic package cannot be fully tested until all dies are assembled. One manufacturing defect or one bad die can cause a whole electronic package to be scrapped, including good dies within the electronic package. Where the electronic package includes a plurality of dies, the cost of yield loss can be greater than single die electronic packages. For multi-die electronic packages, for instance, electronic packages exceeding sixteen dies, the yield losses can be prohibitive.

The yield loss can be reduced by electrically coupling two electronic packages into a single integrated circuit assembly (e.g., package on package (PoP) module). This can decrease the number of dies within each electronic package, and accordingly decrease the yield loss due to a defect in one of the electronic packages. For instance, a thirty-two die integrated circuit assembly can be constructed of two sixteen-die electronic packages. The electronic packages of the (PoP) integrated circuit assembly can be electrically coupled by one or more through-mold vias (TMVs) located around the periphery of a first electronic package. The TMVs can be electrically coupled to an underside of a substrate of a second electronic package. In an example, the TMV can be formed by laser drilling an aperture through the overmold of the first electronic package to expose a conductive pad on a substrate of the first electronic package. Due to process limitations, such as a plasma effect, focus of the laser beam, recasting of the drilled material, barreling of the drilled material, or other processing parameters or processing effects, the laser drilled aperture often includes a taper. Accordingly, a diameter of the TMV can increase as a length of the TMV increases corresponding to the taper of the TMV. For instance, thicker electronic packages can include TMVs with increased diameters (or widths).

To couple an upper electronic package to a lower electronic package, a pinout (e.g., ball grid array) of the upper package can be aligned with the TMVs from the lower electronic package. As previously stated, the TMVs are often located around the periphery of the die of the lower electronic package. In other words, the signal contacts of the second electronic package are not located in the center portion of the second electronic package. Accordingly, the size of the lower electronic package can be increased due to the TMV locations around the periphery of the die. Accordingly, the upper or lower electronic packages may be less desirable to sell as independent electronic packages because of the non-standard arrangement of the signal contacts (e.g., being located around the periphery of the die) and larger size. In addition, where package size is limited, the number of die to die interconnections may be reduced because of limited space for TMVs around the periphery of the electronic package.

Furthermore, having TMVs around the periphery of the die can increase the positional tolerance of the TMV connections between the first electronic package and the second electronic package due to increased flatness tolerance (e.g., warpage). For instance, the position of the TMV can deviate further from the designed location as the TMV is located further from the center of the electronic package, as a result of the increased positional tolerance. If the TMVs are too far out of alignment, electrically coupling the first and second electronic package may be difficult.

Electronic packages including stacked silicon dies can have an increased thickness over single die electronic packages. For instance, the thickness of the electronic package can increase with each additional die. As previously discussed, the TMV can increase in size (e.g., diameter or width) as the length of the TMV increases corresponding to the thickness of the electronic package due to the TMV taper. Larger TMVs can result in larger dimensions for the electronic package or PoP module as previously discussed. Furthermore, electronic packages with sixteen or more dies may include a thickness greater than 1 mm. Forming a TMV through an electronic package with a thickness of 1 mm or greater can be problematic from a manufacturing standpoint.

The present subject matter can provide a solution to this problem, such as by electrically coupling a metallic plated hole located from an interface side of a first package substrate to an interface side of a second package substrate. For instance, the first package substrate can include a first die side and the first interface side. At least one die (e.g., a first die) can be electrically coupled to the first die side of the first package substrate. The second electronic package can include the second package substrate. The second package substrate can include a second die side and the second interface side. At least one second die can be electrically coupled to the second die side of the second package substrate. In other words, the first substrate and the second substrate can be located between the first die and the second die.

The metallic plated hole can electrically couple the first package substrate and the second package substrate. For instance, the metallic plated hole can be located from the interface side of the first package substrate to the interface side of the second package substrate. As the first die and the second die are not located between the first substrate and the second substrate, the size of the multi-package integrated circuit assembly can be reduced because metallic plated hole can be in any part of the substrate. In various examples, the metallic plated hole can be located in the center portion of the first or second substrates, between the first and second dies, within a portion of the first or second substrates corresponding to the periphery of the first or second dies, or the like. Accordingly, the positional tolerance of the metallic plated hole can be improved by locating the metallic plated hole closer to the center of the electronic package, where the positional tolerances can be smaller as previously discussed. In some examples, the length of the metallic plated hole can be shortened by locating the metallic plated hole between the dies. For instance, the distance between the first interface side and the second interface side can be smaller than the distance between substrates of many PoP modules. Because of the shorter metallic plated holes, faster signal communication is possible between the first electronic package and the second electronic package. In a further example, the number of metallic plated holes can be increased because metallic plated holes can be located in the center portion of the electronic package, such as between the first die and the second die. Electrically coupling the first electronic package to a second electronic package can reduce the cost of yield loss by reducing the number of dies (e.g., stacked dies) in each electronic package while having the same number of total dies in the multi-package integrated circuit assembly.

A collective substrate can be attached to the first electronic package. In an example, the collective substrate can be located on a face of the first electronic package opposing the first package substrate. The collective substrate can be electrically coupled to the first die and the second die through the first package substrate. The collective substrate can be electrically coupled to an electronic device. Accordingly, the first electronic package and the second electronic package can be communicatively coupled to the electronic device thought the collective substrate.

The second electronic package can include a contact arrangement that is substantially similar to the contact arrangement of the first electronic package. For instance, both the top and bottom electronic packages can include a standard contact arrangement. The first electronic package or the second electronic package can be sold separately or used individually in other electronic devices. In other words, the first electronic package or the second electronic package need not be specific to the multi-package integrated circuit assembly.

FIG. 1 illustrates an example of a multi-package integrated circuit assembly 100, according to an embodiment. The integrated circuit assembly 100 can include two or more electronic packages, such as a first electronic package 110 and a second electronic package 120. The first electronic package 110 can be communicatively coupled (e.g., electrically coupled) to the second electronic package 120. For instance, the first electronic package 110 can be communicatively coupled to the second electronic package 120 by a metallic plated hole 150. The electronic package can include a package substrate and a die. For instance, the first electronic package 110 can include a first package substrate 112 and a first die 114. The second electronic package 120 can include a second package substrate 122 and a second die 124. At least one die can be electrically coupled to the respective substrate. For instance, the first die 114 can be electrically coupled to the first substrate 112, and the second die 124 can be electrically coupled to the second substrate 122. In an example, the die can be electrically coupled to one or more contacts or routing layers of the substrate. In various examples, the electronic package can be a single-die package or a multi-die package. As shown in the example of FIG.

1, the first electronic package 110 and the second electronic package 120 are single-die packages.

A collective substrate 130 can be attached to one or electronic packages of the integrated circuit assembly 100. In the example, of FIG. 1, the collective substrate 130 is attached to the first electronic package 110. For instance, the first electronic package 110 can include an insulative covering 140. The collective substrate 130 can be attached to a face 142 of the insulative covering 140. In some examples, the collective substrate 130 can be directly attached to a die of the first electronic package 110, such as die 114. The second electronic package 120 is shown without an insulative covering in the example of FIG. 1. It is to be understood that reference to the substrate, electronic package, die, contact, insulative covering, or the like may be referred to generally or to a specific instance shown in one or more of the FIGS. herein, however, such description can apply to various examples of this disclosure.

The die, such as die 114 or 124, can include a semiconductive material, such as monocrystalline silicon, gallium arsenide, or the like. In various examples, the die can be configured as a processor (e.g., graphics processing unit (GPU) or central processing unit (CPU)), memory package (e.g., random access memory (RAM), flash memory, read only memory (ROM)), or other logic or memory package. The die can include at least one electrical contact (die interconnect). For instance, the die interconnect can include, but is not limited to a solder pad, ball grid array (BGA), land grid array (LGA), wire-bond pad, chip carrier contact, or other electrical contact for electrically coupling the die to the substrate, such as substrate 112 or substrate 122 respectively.

The substrate, such as substrate 112 or 122, can provide mechanical support to the die, such as die 114 or die 124, and the substrate can provide one or more electrical routing layers for electrical communication between the die and the electronic device. As shown in FIG. 1, the substrate can include a die side and an interface side. For instance, the first electronic package 110 can include the first package substrate 112 having a first die side 116 and a first interface side 118. The first die 114 can be electrically coupled to the first die side 116 of the first package substrate 112. The second electronic package 120 can include the second package substrate 122 having a second die side 126 and a second interface side 128. The second die 124 can be electrically coupled to the second die side 126 of the second package substrate 122.

The substrate can include one or more conductive materials attached to a dielectric material, such as dielectric material 111 or dielectric material 121. For instance, in the example of FIG. 1, the substrate can include a conductive layer laminated on a dielectric layer. The dielectric material can include at least one dielectric layer fabricated from materials including, but not limited to, FR-4, prepreg, ceramic, epoxy, other glass or fiber filled resin, polyimide, polyester, polyether ether ketone (PEEK), or the like. Accordingly, the substrate can provide mechanical support for the die, electrical connections and routing for the die, or both. In an example, for mechanical support, the substrate can include a core including, but not limited to, a ceramic core.

In an example, the conductive layer can be laminated on two sides of the dielectric layer, such as two opposing sides of the dielectric layer. In a further example, the substrate can include a single sided, double sided, or multi-layer construction (e.g., multiple layers of alternating dielectric and conductive materials). In some examples, the substrate can include a Copper Clad Laminate (CCL). The CCL can include the conductive material (e.g., metallic foil) that can be attached to (e.g., laminated on) one or more dielectric layers of the substrate. In other examples, the conductive material can be printed on to the substrate, for instance with an inkjet printer. In an example, the conductive material can be electrodeposited (electroplated) onto the substrate. The conductive material can be formed into one or more electronic circuits (e.g., routing layers) on the substrate. For instance, the conductive material can be deposited on the dielectric material to form the electronic circuits. In other examples, the conductive material can be a conductive sheet attached to the dielectric material. The conductive sheet can be etched to form the electronic circuit. Accordingly, the conductive material (layer) of the substrate can provide circuit routing, grounding, thermal energy distribution, electromagnetic shielding, or the like.

The substrate can include at least one contact, such as contact 113A-B or contact 123A-B. The contact can be located on the interface side, for example, the interface side 118 or the interface side 128. For instance, as show in the example of FIG. 1, the substrate can include a plurality of contacts, such as a plurality of contacts on the die side and the interface side. In an example, the interface side, such as the first interface side 118, can include a plurality of contacts (referred to herein as first contacts 113A). The die side can include a plurality of contacts, such as contacts 113B. In a further example, the interface side, such as the second interface side 128, can include a plurality of contacts (referred to herein as second contacts 123A). The die side 126 can include a plurality of contacts such as contacts 123B. In some examples, the conductive layer can be configured as one or more contacts, such as first contacts 113A-B or second contacts 123A-B). For instance, a portion of the conductive layer can include a contact surface that is exposed for electrical communication with a mating contact.

As shown, the contact, such as contact 113B or 123B, can be electrically coupled to the die. For instance, the contact can be electrically coupled to another contact located on the die side, such as the first die side 116 or the second die side 126. The substrate can include a plurality of contacts located on the interface side or the die side. For example, the plurality of contacts can be arranged in a pattern, for instance, arranged in an array. In a further example, the die, such as die 114 or the die 124, can be electrically coupled to the substrate by wire bonding, soldering, or other electrical coupling.

In various examples the plurality of contacts can be arranged to be interchangeable with other dies, electronic packages, or electronic devices. For instance, the plurality of contacts can be arranged in an industry standard format. In an example, one or more of the plurality of contacts can be located in a center portion of the substrate or within a location on the die side or the interface side corresponding to a periphery of the die. Locating one or more of the plurality of contacts within the center portion of the substrate or a location corresponding to the periphery of the die can to reduce the size of the electronic package. For instance, where the contacts can be placed in any region of the substrate, the size of the substrate can be reduced, for example, by increasing the density of contacts located on the substrate.

In some examples, the first electronic package 110 and the second electronic package 120 can have the same footprint. For instance, the length and width of the first electronic package 110 and the second electronic package 120 can be substantially the same size (e.g., within manufacturing tolerances). In further examples, the first electronic package 110 can have the same contact pattern as the second electronic package 120, can include the same contact assignment (e.g., corresponding to electrical function), or the like. In an example, the first electronic package 110 can be identical to the second electronic package 120. Accordingly, the die or the electronic package can be interchangeable. For instance, the first die 114 can be interchangeable with the second die 124, the first electronic package 110 can be interchangeable with the second electronic package 120, or the like. Accordingly, any combination of memory or logic packages or dies can be used.

As previously discussed, the first electronic package 110 can include an insulative covering, such as the first insulative covering 140. In an example, the insulative covering can be located on the first die side 116 and the first die 114 to increase the robustness of the first electronic package 110, such as the electrical coupling of the first die 114 to the first substrate 112. In a further example, the insulative covering 140 can electrically isolate the first die 114, die interconnects, or the contacts 113A from other electrical components of the integrated circuit assembly 100. In an example, the insulative covering 140 can cover the first die 114 and the first substrate 112. For instance, the insulative covering 140 can encapsulate the die 114 on the first substrate 112. The insulative covering, such as insulative covering 140, can be constructed of various materials including, but not limited to, liquid crystal polymer, nylon, epoxy, silica, or other mold compound materials.

In an example the collective substrate 130 can be electrically coupled to the first die 114 and the second die 124. The collective substrate 130 can be an interface for communicatively coupling (e.g., electrically coupling) the integrated circuit assembly 100 to the electronic device, such as a circuit board of the electronic device. In an example, the second electronic package 120 can be electrically coupled to the collective substrate 130 through the first substrate 112, as shown in the example of FIG. 1. In an example, the collective substrate 130 can include a first surface 132 and a second surface 134. The second surface 134 can be located on a side of the collective substrate 130 opposing the first surface 132.

The collective substrate 130 can be attached to the first electronic package 110. For instance, the collective substrate 130 can be attached to the face 142 of the first electronic package 110. As shown in the example of FIG. 1, the collective substrate 130 can be located on a side of the first electronic package 110 opposing the first package substrate 112, such as on the face 142. The collective substrate 130 can be attached to the first electronic package 110 with adhesive 138 (e.g., epoxy), die attach film, thermal bonding, ultra-sonic welding, or the like.

In various examples, the collective substrate 130 can include, but is not limited to, a construction as previously described with regard to the package substrate, such as the first package substrate 112 or the second package substrate 122. For instance, the collective substrate 130 can include one or more contacts (also referred to herein as third contacts) or routing layers. For instance, the first side 132 can include a contact 136A and the second side can include a contact 136B. In some examples, as previously described, the contact, such as contact 136A or 136B, can include a solder pad, wire bonding pad, LGA, BGA, or the like. In an example, the contact, such as contact 136A or the plurality of contacts of the collective substrate 130, can be electrically coupled to a plurality of corresponding contacts of the first package substrate 112. In an example, the plurality of contacts (e.g., first contacts 113A) of the first substrate 112 can be wire bonded to the plurality of contacts 136A, for instance, a wire 144 can be welded (e.g., wire bonded) to electrically couple the first electronic package 110 and the collective substrate 130, as shown in FIG. 1. The one or more contacts 136A can be electrically coupled to one or more contacts 136B. The contact 136B can be configured to be electrically coupled to the electronic device. For instance, the contact 136B can include a solder ball or be one of a plurality of contacts of an LGA or BGA. Accordingly, the first substrate 112 (e.g., the conductive layers or contacts of the first substrate 112) can be electrically coupled to the electronic device through the collective substrate 130.

An insulative covering, such as an insulative covering 160 can be attached to the first electronic package 110. For instance, the insulative covering 160 can be disposed over the first electronic package 110. In a further example, the insulative covering 160 can be disposed on the first interface side 118 and the first side 132 of the collective substrate 130. In other words, the insulative covering 160 can encapsulate the die 114 or the first side 132. The insulative covering 160 can include various materials and functions as previously described with regard to insulative covering 140. In an example, the insulative covering 160 can include a face, such as face 162. The face 162 can be located on an opposing side of the insulative covering 160 from the first surface 132.

In the example, of FIG. 1, the insulative covering 160 can include an aperture 190. The aperture can include a first opening on the face 162 and extend to a second opening adjacent to the first interface side 118. For instance, the first contact 113A can be longitudinally aligned within the second opening, for example, aligned within a bore along a longitudinal direction of the aperture. In various examples, the side wall of the aperture 190 can be vertical, tapered, curved, or any geometry. In the example, of FIG. 1, the aperture 190 is tapered, such as an aperture formed by laser drilling.

The metallic plated hole 150 can be located in the aperture 190. For instance, can include a first end 152 and a second end 154. The first end 152 can be electrically coupled to the first contact, such as contact 113A. The second end 154 can be parallel with the face 162. In some examples, the second end 154 can be coplanar with the face 162 or offset from the face 162, such as protruding from the insulative covering 160. In other words, the metallic plated hole 150 can be exposed through the insulative covering 160. In various examples, the metallic plated hole 150 can include, but is not limited to, a plated through-hole, through-mold via, micro via, or the like. For instance, the metallic plated hole 150 can be deposited along the wall of the aperture 190, such as electroplated (e.g., electrolessly plated), chemically deposited, vapor deposited, or the like. Accordingly, the metallic plated hole 150 can be located along the wall of the aperture 190 and include a lumen extending through the metallic plated hole 150. In some examples, the metallic plated hole 150 can be constructed of a material including, but not limited to, gold, silver, tin, copper, or other conductive material. In further examples, the lumen can be filled with a conductive filler. The conductive filler can include, but is not limited to, gold, silver, tin, copper, or other conductive material. In an example, the material of the metallic plated hole 150 can be the same material as the conductive filler. The conductive filler can be deposited into the lumen as previously described with the deposition of the metallic plated hole 150. In the example of FIG. 1, the metallic plated hole 150 can include a conductive interconnect 156, such as a solder ball, located on the second end 154.

As shown in FIG. 1, the metallic plated hole 150 can be located from the first interface side 118 to the second interface side 128 to provide a package connection interface for communicatively coupling the first electronic package 110 to the second electronic package 120. For instance, the metallic plated hole 150 can electrically couple the first contact 113A to the second contact 123A. For instance, the metallic plated hole 150 can be electrically coupled (e.g., soldered) to the second contact 123A by the conductive interconnect 156 (e.g., solder ball or solder paste). Accordingly, in an example, the metallic plated hole 150 can electrically couple the first die 114 to the second die 124 to communicate electrical signals between the first die 114 and the second die 124. Because of the orientation of the first electronic package 110 with respect to the second electronic package 120, the metallic plated hole 150 can have a dimension (e.g., length) along a longitudinal axis of the metallic plated hole 150 that is 10 µm, 500 µm, or any dimension therebetween. For instance, the first interface side 118 and the second interface side 128 can be located in close proximity because the first die 114 and the second die 124 are located on opposing sides of the first substrate 112 and the second substrate 122 respectively. Accordingly, the distance between the first interface 118 side and the second interface side 128 can be reduced. For instance, the dimension of the metallic plated hole 150 can be shorter than the thickness of the electronic package (e.g., the first electronic package 110) or the die, such as the first die 114 or a plurality of stacked dies within the first electronic package 110.

In various examples, a plurality of the metallic plated holes 150 can be communicatively coupled between the first electronic package 110 and the second electronic package 120. For instance, the plurality of metallic plated holes 150 can be located from the first interface side 118 to the second interface side 128. In some examples, at least one metallic plated hole 150 can be located within a periphery of the first die 114 or the second die 124, such as a location on the first interface side 118 or the second interface side 128 corresponding to the perimeter of the respective die, as shown in the example of FIG. 3 and described herein. In an example, at least one of the metallic plated holes 150 can be located between the first die 114 and the second die 124, as shown in FIG. 1.

Figure 2:
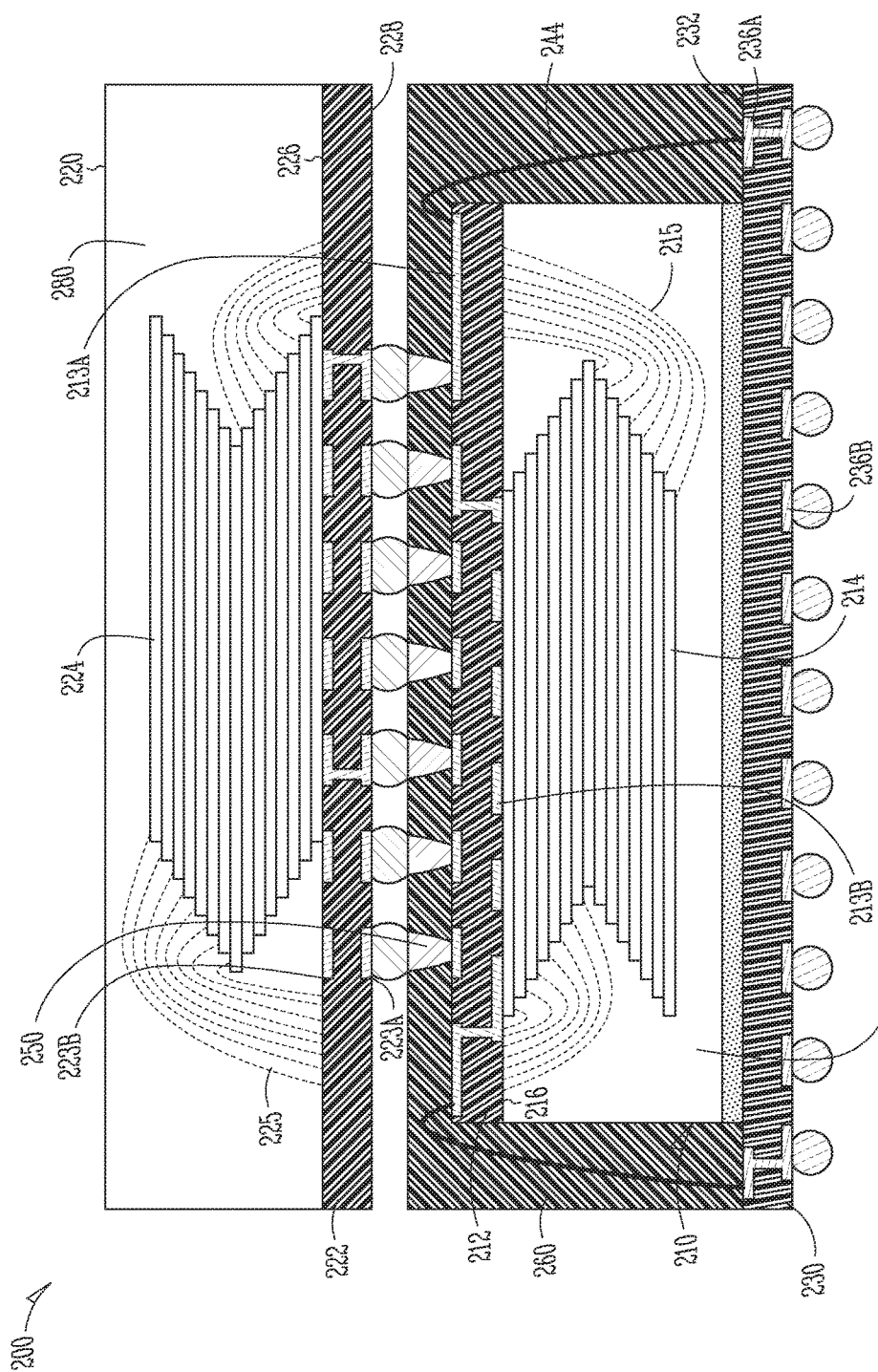
FIG. 2 depicts a three-dimensional multi-package integrated circuit assembly, according to an embodiment.

FIG. 2 is a perspective view of a three-dimensional multi-package integrated circuit assembly 200, according to an embodiment. The integrated circuit assembly 200 can include a first electronic package, such as first electronic package 210 and a second electronic package, such as a second electronic package 220. The first electronic package 210 or the second electronic package 220, can include a stacked die package. In the example, of FIG. 2, the first electronic package 210 and second electronic package 220 are shown in elevation and the first substrate 212, second substrate 222, collective substrate 230, metallic plated hole 250, and insulative covering 260 are shown in cross section.

The stacked die package can include a plurality of dies, such as a plurality of dies 114 or dies 124. The plurality of dies can be stacked on one another. For instance, an upper die can be attached to a top surface of a lower die and so on. In various examples, the plurality of dies can be attached to one another by solder, die attached film, adhesive, or the like. The plurality of dies can be located on the first die surface 216 or the second die surface 226 respectively. The stacked die can include any number of dies including, but not limited to, 2, 4, 16, 32 dies, or the other number of dies. In the example shown in FIG. 2, the alignment of the dies can be staggered to expose a portion of an upper face of each die. The exposed portion can include a contact pad for electrically coupling the die to the substrate, such as the corresponding first package substrate 212 or second package substrate 222. For instance, a wire, such as a wire 215 can be bonded between the substrate (e.g., first substrate 212) and the die (e.g., first die 214). A wire 225 can be electrically coupled between one or more of the plurality of second dies 224 and the second substrate 222. Accordingly, the dies can be electrically coupled to their respective substrates. By wire bonding the plurality of dies to the substrate, space on the plurality of dies can be saved by reducing the need for through silicon vias for electrically coupling the dies together or electrically coupling the plurality of dies to the substrate.

The second substrate 222 can be electrically coupled to the first substrate 212 by one or more metallic plated holes, such as a metallic plated hole 250. In an example, the metallic plated hole 250 can be electrically coupled to one or more of the plurality of first package dies 214 and one or more of the plurality of second package dies 224. For instance, a plurality of second contacts, such as second contact 223A, located on the second substrate 222 can be electrically coupled to a plurality of respective first contacts, such as contact 213A of the first substrate 212. In various examples, the first contact 213A can be electrically coupled to the first die 214 or the collective substrate 230. For instance, in some examples, the first contact 213A can be electrically coupled (e.g., wire bonded by wire 244) to contact 236A. Accordingly, the plurality of dies 224 of the second electronic package 220 can be electrically coupled to the collective substrate 230 through the first package substrate 212. For instance, the collective substrate 230 can be electrically coupled to the plurality of first package dies 214 and the plurality of second package dies 224 through the first package substrate 212.

The first electronic package 210 or the second electronic package 220 can include an insulative covering as shown in FIG. 2. For instance, the first electronic package 210 can include a first insulative covering 240. The first insulative covering 240 can encapsulate the plurality of first dies 214. In a further example, the second electronic package 220 can include a second insulative covering 280. The second insulative covering can encapsulate the plurality of second dies 224. An insulative covering, such as the third insulative covering 260, can be disposed over the first electronic package 210. In other words, the insulative covering 260 can encapsulate the plurality of first dies 214 and a first side 232 of the collective substrate 230.

As shown in the example of FIG. 2, at least one of the plurality of metallic plated holes, such as metallic plated hole 250, can be located between at least one of the plurality of first dies 214 and at least one of the plurality of second dies 224. For instance, the dimension of the metallic plated hole 250 can be shorter than the thickness of the electronic package (e.g., the first electronic package 210) or the die, such as the plurality of first dies 214 (e.g., stacked dies). In an example, the metallic plated hole 250 can include a dimension along a longitudinal direction of the metallic plated hole 250 (e.g., between the first package 210 and the second package 220) that is 10 µm, 500 µm, or any dimension therebetween.

FIG. 3 illustrates an example of a top view of a substrate, such as substrate 312 of a multi-package integrated circuit assembly 300, according to an embodiment. In some examples, the first electronic package 110, the first electronic package 210, the second electronic package 120, or the second electronic package 220 can include the substrate 312. The substrate 312 can include a plurality of contacts, such as contacts 313C. In the example of FIG. 3, the plurality of contacts 313C can be configured for being electrically coupled to the metallic plated hole, such as metallic plated hole 150 or metallic plated hole 250. In the example, of FIG. 3, the plurality of contacts 313C can be arranged in a pattern, such as a grid pattern. For instance, the plurality of contacts 313C can be electrically coupled to the first electronic package (e.g., the electronic package 110 or the electronic package 210) or the second electronic package (e.g., the second electronic package 120 or the second electronic package 220) through one or more metallic plated holes. The first electronic package or the second electronic package can include a plurality of contacts (die interconnects) having the same pattern and the plurality of contacts 313C. Accordingly, the contact pattern of the first electronic package or the second electronic package can be configured to be interchangeable with other electronic packages or electronic devices.

At least one of the plurality of contacts 313C can be located within a periphery 302 of one or more dies, such as the first die or the second die. In a further example, at least one of the plurality of metallic plated holes can be located within a periphery of the first die or the periphery of the second die. As described herein, the periphery 302 can include a location on the substrate 312 corresponding to the perimeter of the respective die. Where the electronic package includes a stacked die, such as the stacked die 214 or the stacked die 224, the periphery 302 can include a location on the substrate 312 corresponding to the perimeter of any one of the dies within the stacked die or a combined periphery of all of the dies within the stacked die. Accordingly, the metallic plated hole can be located between the first die and the second die.

The dimension of the metallic plated hole (e.g., along the longitudinal direction) can be reduced by locating the metallic plated hole between the first die and the second die. For instance, the metallic plated hole can include a dimension that is 10 μm, 500 μm, or any dimension therebetween. Locating the metallic plated hole between the first die and the second die can increase the number of metallic plated holes between the first electronic package and the second electronic package. For example, by positioning the first substrate and the second substrate between the first die and the second die, a region of the first substrate and the second substrate located between the first die and second die (e.g., center portion) can be used for electrically coupling the first electronic package to the second electronic package.

In a further example, warpage of the substrate 312 can cause variability in a dimension between the first substrate and the second substrate. The effects of warpage can be reduced in the center portion of the package. In an example, the center portion can be located in the center 50% of the length or width of the substrate 312. The variability of the dimension (e.g., related to warpage or tolerance) can be smaller in the center portion and can be greater towards the perimeter of the substrate. Locating the plurality of metallic plated holes in the center portion of the substrate can reduce the effects of substrate warpage on electrically coupling the metallic plated hole between the first electronic package and the second electronic package. Accordingly, the plurality of metallic plated holes, such as the second end 154 of the metallic plated holes, can include a substantially planar alignment. For instance, the second ends, such as second end 154, can be aligned within a tolerance of less than 150 microns, such as 30 to 100 microns in a direction perpendicular to the substrate, such as substrate 112 or substrate 212.

In an example, locating the plurality of contacts, such as contacts 313C (and correspondingly, the metallic plated holes) in the center portion of the substrate 312 can reduce the size of the electronic package as more electrical connections can be located between the first die and the second die. Accordingly, space between the die and the perimeter of the substrate can be reduced corresponding to the reduced number of electrical connections located outside of the center portion of the substrate or outside of the periphery of the die. In a further example, because the first and second packages can include contacts located in the center portion of the electronic package (e.g., between the first die and the second die), the first electronic package and the second electronic package can be interchangeable. For instance, the first electronic package and the second electronic package can have the same size, the same contact pattern, or both.

In the example of FIG. 3, the substrate 312 can include a plurality of contacts 313D. For instance, the plurality of contacts 313D can be located around a perimeter of the substrate 312. In other words, the plurality of contacts 313D can be located between the perimeter of the substrate 312 and the plurality of contacts 313C. The plurality of contacts 313D can be electrically coupled to the plurality of contacts 313C or other contacts on the substrate, such as one or more contacts located on a die side or interface side of the substrate 312. In an example, the plurality of contacts 313D can be electrically coupled to the collective substrate, such as the collective substrate 130 or the collective substrate 230 as previously described. For instance, the plurality of contacts 313D can be wire bonded to a plurality of contacts, such as a plurality of contacts 136A located on the collective substrate 130. Accordingly, the first die and the first electronic package as well as the second die and the second electronic package can be electrically coupled to the collective substrate.

FIGS. 4A-E depict an example of a method 400 a process of making a multi-package integrated circuit assembly, such as a multi-package integrated circuit assembly including at least one metallic plated hole located between dies of the first and second respective electronic packages, such as the integrated circuit assembly 100 or the integrated circuit assembly 200 previously described in the examples herein and shown for instance in FIGS. 1-3. In describing the method 400, reference is made to one or more components, features, functions, and processes previously described herein. Where convenient, reference is made to the components, features, processes and the like with reference numerals. Reference numerals provided are exemplary and are nonexclusive. For instance, features, components, functions, processes, and the like described in the method 400 include, but are not limited to, the corresponding numbered elements provided herein. Other corresponding features described herein (both numbered and unnumbered) as well as their equivalents are also considered.

Figure 4A:
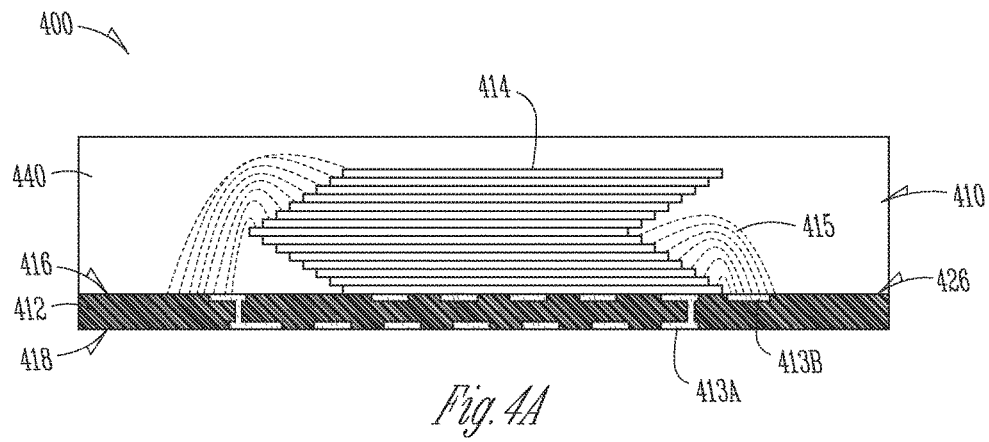
FIGS. 4A-E depict an example of a process of making an multi-package integrated circuit assembly, according to an embodiment.

At FIG. 4A, a first electronic package 410 can be provided. The first electronic package 410 can include a first package substrate 412 having a first die side 416 and a first interface side 418. The first die can be electrically coupled to the first die side 416. The first die side can include at least one contact 413B. In an example, the first die can be wire bonded to the first die side, such as wire bonded to the first contact 413B. The first interface side 418 can include a first contact 413A. The first contact 413A can be electrically coupled to the first die, such as through first contact 413B.

In further examples, the first contact 413A can be one of a plurality of first contacts. For instance, the plurality of first contacts can be arranged for attaching a BGA on the first interface side 418. In a further example, at least one of the contacts can be formed in a center portion of the first interface side 418, such as within a region of the first substrate 412 corresponding to a periphery of the first die.

In the example of FIG. 4A, the first electronic package 410 includes a stacked die package 414 having a plurality of dies attached together. The plurality of dies of the stacked die package 414 can be wire bonded to the first package substrate 412. For instance, at least one die of the stacked die package 414 can be wire bonded to the first contact 413B (e.g., by wire 415) to electrically couple the first stacked die package 414 to the first contact 413A (e.g., located on the first interface side 418) through the first contact 413A. For instance, the first contact 413A can be electrically coupled to the first contact 413B through the first substrate 412, for example, by one or more routing layers or circuit interconnections of the first substrate 412. In further examples, the first die or first stacked die 414 can be soldered or otherwise electrically coupled to the first contact 213A. A first package insulative covering 440 can be applied on the first die or the first die side 416 to construct the first electronic package 410. For instance, the first die, such as the first stacked die 414 can be encapsulated with the first insulative covering 440 as previously described herein.

Figure 4B:
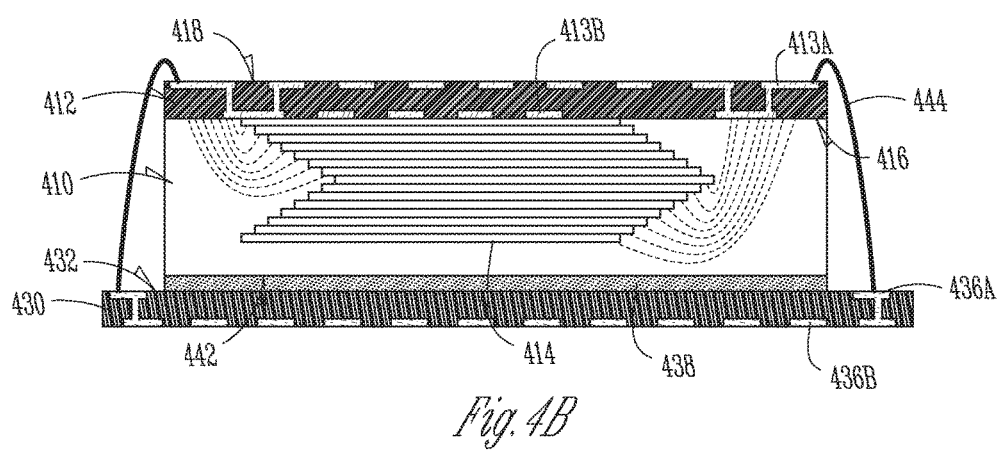

At FIG. 4B, a first surface 432 of a collective substrate 430 can be attached to the first electronic package 410. For instance, the first surface 432 of the collective substrate 430 can be attached to the first electronics package 410 with adhesive, die attached film, solder, or the like. In the example of FIG. 4B-E, the collective substrate 430 can be attached for the first electronic package 410 by an adhesive 438. In an example, the collective substrate 430 can be attached to a face 142 of the first electronic package 410 opposing the first package substrate 412. The first stacked die 414 can be located between the first surface 432 and the first die side 416.

The first package substrate 412 can be electrically coupled to the collective substrate 430. For instance, the first contact 413A can be electrically coupled to the contact 436A. In the example, of FIG. 4B, the first contact 413A is wire bonded to the contact 436A, such as by a wire 444. In a further example, a plurality of first contacts (e.g., contacts 413A) of the first substrate 412 can be electrically coupled to a plurality of corresponding contacts (e.g., 436A-B) of the collective substrate 430, for instance, by wire bonding.

Figure 4C:
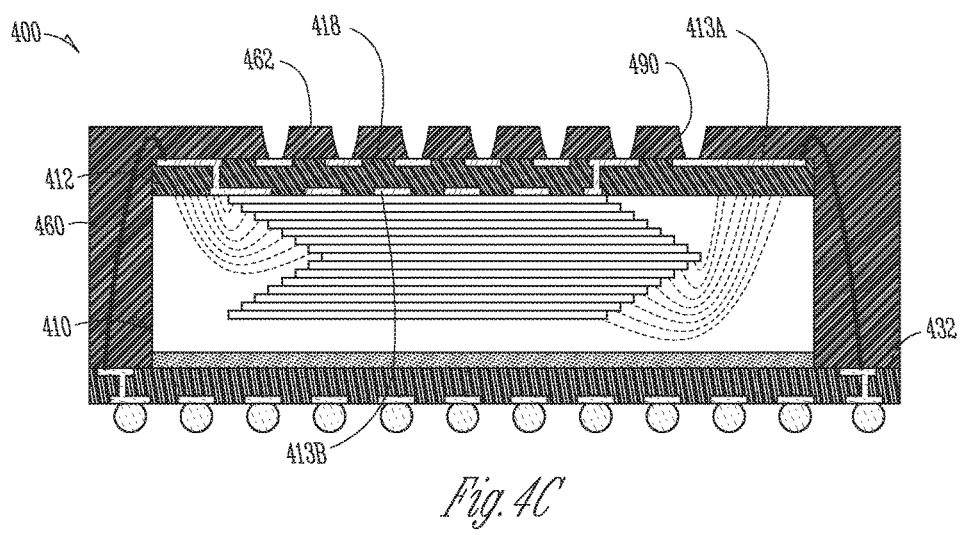

At FIG. 4C, an insulative covering, such as insulative covering 460 can be applied to the first electronic package 410. For instance, the insulative covering 460 can be applied to cover the first surface 432 and cover the first electronic package 410. In other words, the insulative covering 460 can encapsulate the first electronic package 410 on the first surface 432.

The insulative covering 460 can include a plurality of apertures, such as aperture 490. For instance, the apertures can be formed in a face of the insulative covering, such as face 462. The aperture can be formed to include a first opening located on the face 462 and a second opening located on the first interface side 418. The contact 413A can be located within the second opening. For instance, the first contact 413A can be aligned within the second opening along a longitudinal direction, for example, aligned within a bore of the aperture along a longitudinal direction of the aperture. In an example, the aperture 460 can be formed by laser drilling the insulative covering 460 from the face 462 to the first interface side 418. In various examples, a side wall of the aperture 490 can formed to be vertical, tapered, curved, or any geometry. In the example, of FIG. 4C, the aperture 490 is tapered, such as an aperture formed by laser drilling.

Figure 4D:
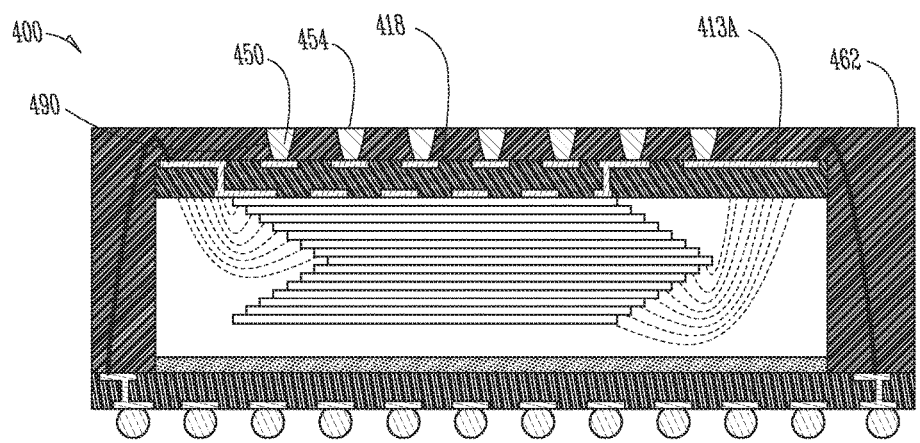

At FIG. 4D, a plurality of metallic plated holes, such as metallic plated hole 450, can be formed within the apertures, such as aperture 490. For instance, the plurality of metallic plated holes can be located from the first interface side 418 to the face 462. In an example, the metallic plated hole 490 can be formed to have a dimension along a longitudinal axis of the metallic plated hole 490 that is 10 μm, 500 μm, or any dimension therebetween. The metallic plated hole can be plated into the aperture, such as deposited one the side wall of the aperture 490. For instance, the metallic plated hole 450 can be deposited by electroplating (e.g., electrolessly plating), chemically depositing, vapor depositing, or the like. Accordingly, the metallic plated hole 450 can be located along the wall of the aperture 490. In some examples, the metallic plated hole 450 can be constructed of a material including, but not limited to, gold, silver, tin, copper, or other conductive material. Accordingly, the metallic plated hole, such as metallic plated hole 450, can be electrically coupled to the first contact 413A. For instance, in the example of FIG. 4D, a plurality of metallic plated holes can be electrically coupled to a plurality of respective first contacts located on the first interface side 418, such as the first contact 413A.

In an example, the metallic plated hole 450 can include a lumen extending through the metallic plated hole 450. In further examples, the lumen can be filled with a conductive or non-conductive filler. The conductive filler can include, but is not limited to, solder, metallic plating (e.g., gold, silver, tin, copper, or other conductive material), a polymer (e.g., epoxy), or the like. In an example, the material of the metallic plated hole 450 can be the same material as the conductive filler. The conductive filler can be deposited into the lumen as previously described with the deposition of the metallic plated hole 450. A At FIG. 4E, the metallic plated hole 450 can be electrically coupled to a second electronic package 420. The second electronic package 420 can include a second package substrate 422 and a second die. The second package substrate 422 can include a second die side 426 and a second interface side 428. A second contact 423A can be located on the second interface side 428 and is electrically coupled to the second die. The metallic plated hole 450 can be electrically coupled to the second contact 423A. For instance, in the example of FIG. 4, the metallic plated hole 450 can include a conductive interconnect 456, such as a solder ball, located on the second end 454. The metallic plated hole 450 can be electrically coupled (e.g., soldered) to the second contact 423A by the conductive interconnect 456 (e.g., solder ball or solder paste). In some examples, a second contact 423A is one of a plurality of second contacts arranged to attach a BGA on the second interface side 428. For instance, the second electronic package 420 can be configured to have a contact pattern that is the same as the contact pattern of the first electronic package. In some examples, the plurality of contacts, such as contact 423A can be formed in a location in a center portion of the second interface side 428. For instance, one or more contacts 423A can be located within a periphery of the second die (e.g., similar to the example of FIG. 3). The center portion can be located in the center 50% of the length or width of the second substrate 422. In an example, the second electronic package 420 can be the same size as the first electronic package 410. For instance, the first electronic package 410 and the second electronic package 420 can be configured to be interchangeable. In the example of FIGS. 4A-E, the second electronic package 420 can be provided as (or, e.g., constructed to be) a stacked die package having a plurality of stacked dies 414 attached together. In some examples, the second die or the plurality of second dies 424 can be wire bonded to the second die side 426, such as by a wire 425. A second package insulative covering 280 can be applied on the second die (or the plurality of second stacked dies 414) or the second die side 426 to construct the second electronic package 420.

Coupling the metallic plated hole, such as the plurality of metallic plated holes 450, to the second electronic package 420 can include forming one or more of the metallic plated holes from the first interface side 418 to the second interface side 428. For instance, the metallic plated hole 450 can be electrically coupled between the first electronic package 410 and the second electronic package 420 at a location between the first die (e.g., first stacked die 414) and the second die (e.g., second stacked die 424). In an example, at least one of the metallic plated holes 450 can be located within a periphery of the first die, such as the first stacked die 414. For instance, the metallic plated hole 450 can be electrically coupled to the second substrate 422 at a location on the second substrate 422 (e.g., a location of a contact 423A) corresponding to the periphery of the second die or second stacked die 424. In a further example, the metallic plated hole 450 can be formed or configured to include a dimension along a longitudinal axis of the metallic plated hole 450 that is 10 μm, 500 μm, or any dimension therebetween.

Figure 4E:
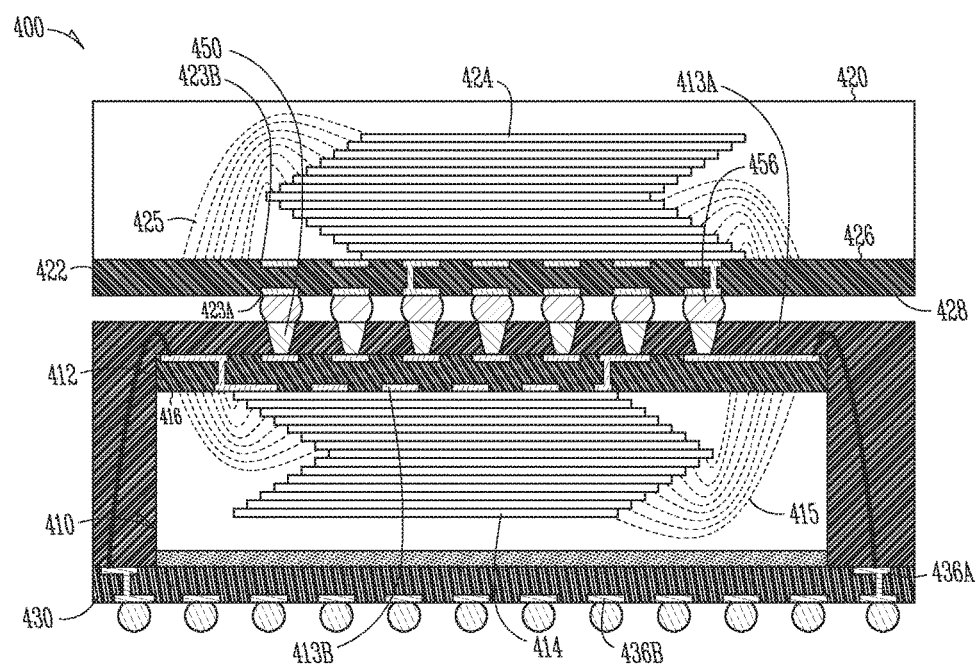

In the example shown in FIG. 4E, electrically coupling the metallic plated hole 450 to a second electronic package 420 can include soldering the metallic plated hole 450 to the contact 423A located on the second interface side 428. For instance, a conductive interconnect 456 (e.g., solder) can be applied to the metallic plated hole 450 or the contact 423A and heated to form an electrical connection. In a further example, the second contact 423A can be one of a plurality of second contacts arranged for coupling a BGA on the second interface side 428. The BGA can be disposed on the second end (e.g., 454 of the metallic plated hole 450 or on the second contact 423A, such as on a plurality of second contacts. Accordingly, the first electronic package 410 can be electrically coupled to the second electronic package 420 by the metallic plated hole 450.

The first die (e.g., stacked die 414) and the second die (e.g., stacked die 424) can be electrically coupled to the collective substrate 430, such as electrically coupled to one or more contacts 436A or electrical contacts 436B. For instance, one or more of the plurality of contacts, such as contact 413A or contact 423A can be electrically coupled to one or more corresponding contacts (e.g., 136A-B) of the collective substrate 430 through the first package substrate 412. In an example, the first electronic package 410 can be electrically coupled to the second electronic package 420 to provide electrical communication between the first electronic package 410 and the second electronic package 420. Where the first electronic package 410 or the second electronic package 420 includes a stacked die, such as the stacked die 414 or the stacked die 424 as shown in the example of FIG. 4E, the plurality of dies of the stacked die 414 or the stacked die 424 can be electrically coupled to the collective substrate 430 through the first substrate 412. In a further example, a BGA formed on the collective substrate 430, such as on contact 436B to electrically couple the first electronic package 410 and the second electronic package 420 to the electronic device.

Figure 5:
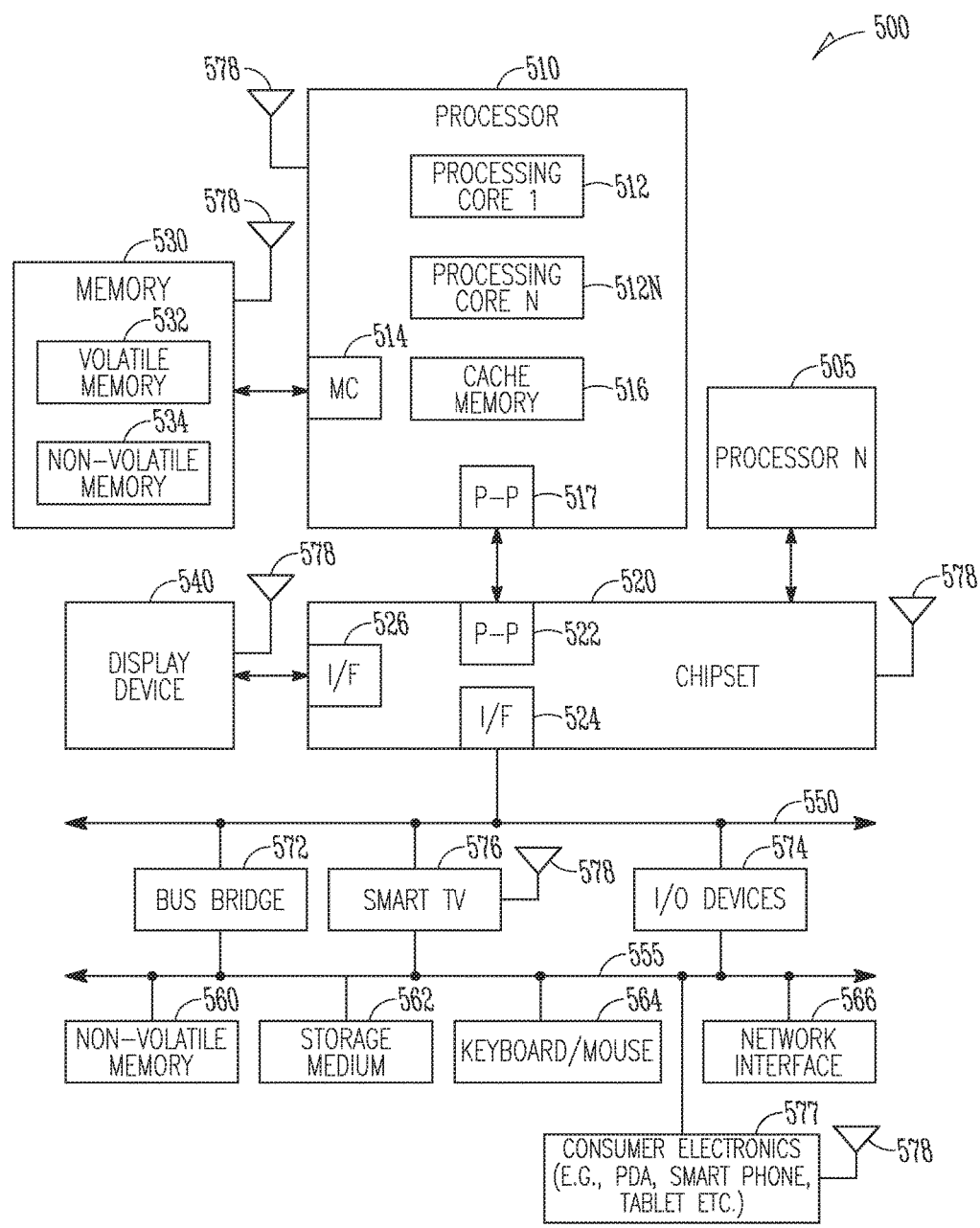
FIG. 5 illustrates a system level diagram in accordance with some embodiments of the invention.

FIG. 5 illustrates a system level diagram, according to one embodiment of the invention. For instance, FIG. 5 depicts an example of an electronic device (e.g., system) including a multi-package integrated circuit assembly, such as an integrated circuit assembly including a first electronic package electrically coupled to a second electronic package by a metallic plated hole located between dies of the first and second respective electronic packages, as described in the present disclosure. FIG. 5 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. For instance, the processing core 612 or processing core 612N can include the first die 414 or the second die 124, as previously described herein. In one embodiment, system 600 includes multiple processors including 610 and 605, where processor 605 has logic similar or identical to the logic of processor 610. In an example, the processor 610 can include the integrated circuit assembly 100. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. In an example, the memory 630 can include the first electronic package 110 or the second electronic package 120. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family. Home Plug AV (HPAV), Ultra Wide Band (UWB), Bluetooth. WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. In an example, the chipset 620 can include the integrated circuit assembly 100. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620, via interface 624, couples with a non-volatile memory 660, a mass storage device(s) 662, a keyboard/mouse 664, a network interface 666, smart TV 676, consumer electronics 677, etc. In various examples, the integrated circuit assembly 100 can be included in at least one or more of the display 640, smart TV 676, I/O devices 674, non-volatile memory 660, storage medium 662, network interface 666, processor 605, or consumer electronics device 677.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate dies, electronic packages, or integrated circuit assemblies. For example, although cache memory 616 is depicted as a separate block within processor 610, cache memory 616 (or selected aspects of 616) can be incorporated into processor core 612.

VARIOUS NOTES & EXAMPLES

Each of these non-limiting examples may stand on its own, or may be combined in various permutations or combinations with one or more of the other examples. To better illustrate the method and apparatuses disclosed herein, a non-limiting list of embodiments is provided here:

Example 1 is a multi-package integrated circuit assembly comprising: a first electronic package including a first package substrate having a first die side and a first interface side, a first die electrically coupled to the first die side of the first package substrate; a second electronic package including a second package substrate having a second die side and a second interface side, a second die electrically coupled to the second die side of the second package substrate; a metallic plated hole electrically coupling the first package substrate and the second package substrate, wherein the metallic plated hole is located from the interface side of the first package substrate to the interface side of the second package substrate; and a collective substrate attached to the first electronic package, wherein the collective substrate is located on a face of the first electronic package opposing the first package substrate, and the collective substrate is electrically coupled to the first die and the second die through the first package substrate.

In Example 2, the subject matter of Example 1 optionally includes wherein at least one of the first package and the second package includes a plurality of contacts arranged for a ball grid array (BGA).

In Example 3, the subject matter of any one or more of Examples 1-2 optionally include wherein at least one of the first die and the second die is a stacked die package having a plurality of dies attached together.

In Example 4, the subject matter of Example 3 optionally includes wherein the plurality of dies of the second electronic package are wire bonded to the second package substrate.

In Example 5, the subject matter of any one or more of Examples 1-4 optionally include wherein the plurality of dies of the second electronic package are electrically coupled to the collective substrate through the first package substrate.

In Example 6, the subject matter of any one or more of Examples 1-5 optionally include wherein the first electronic package and the second electronic package include a plurality of contacts located in a center portion of the first interface side and the second interface side respectively.

In Example 7, the subject matter of any one or more of Examples 1-6 optionally include wherein the first electronic package and the second electronic package have the same footprint.

In Example 8, the subject matter of any one or more of Examples 1-7 optionally include wherein a contact pattern of the first electronic package and the second electronic package are identical.

In Example 9, the subject matter of any one or more of Examples 1-8 optionally include wherein the first die is wire boded to the first die side.

In Example 10, the subject matter of any one or more of Examples 1-9 optionally include wherein a plurality of contacts of the first package substrate are electrically coupled to a plurality of corresponding contacts of the collective substrate.

In Example 11, the subject matter of any one or more of Examples 1-10 optionally include a first insulative covering over the first die and the first die side and a second insulative covering over the second die and the second die side.

In Example 12, the subject matter of any one or more of Examples 1-11 optionally include an insulative covering located between the first interface side and the second interface side, wherein the metallic plated hole is extended through the insulative covering.

In Example 13, the subject matter of any one or more of Examples 1-12 optionally include wherein the metallic plated hole is located within a periphery of the first die.

In Example 14, the subject matter of any one or more of Examples 1-13 optionally include a plurality of metallic plated holes located from the interface side of the first substrate to the interface side of the second substrate, wherein the plurality of metallic plated holes are located within a periphery of the first die.

In Example 15, the subject matter of any one or more of Examples 1-14 optionally include wherein the metallic plated hole is located between the first die and the second die.

In Example 16, the subject matter of any one or more of Examples 1-15 optionally include wherein the metallic plated hole is located within a periphery of the second die.

In Example 17, the subject matter of any one or more of Examples 1-16 optionally include wherein the metallic plated hole includes a dimension along a longitudinal axis of the metallic plated hole that is 10 µm, 500 µm, or any dimension therebetween.

In Example 18, the subject matter of any one or more of Examples 1-17 optionally include wherein the collective substrate is electrically coupled to the first package substrate by wire bonding.

In Example 19, the subject matter of Example 18 optionally includes wherein the collective substrate includes a BGA.

In Example 20, the subject matter of any one or more of Examples 1-19 optionally include wherein the metallic plated hole is electrically coupled to the first die and the second die.

Example 21 is a method of electrically coupling a first electronic package to second electronic package of a multi-package integrated circuit assembly, the method comprising: attaching a first surface of a collective substrate to a first electronic package, the first electronic package including a first package substrate having a first die side and a first interface side, the first die located between the first surface and the first die side, wherein a first die is electrically coupled to the first die side, and the first interface side includes a first contact electrically coupled to the first die; electrically coupling the first package substrate to the collective substrate; applying a insulative covering on the first electronic package and the first surface of the collective substrate, wherein a face of the insulative covering and the collective substrate are located on opposing sides of the first electronic package; forming an aperture in the face, the aperture including a first opening located on the face and a second opening located on the first interface side, wherein the first contact is located within the second opening; forming a metallic plated hole in the aperture, the metallic plated hole electrically coupled to the first contact; electrically coupling the metallic plated hole to a second electronic package, the second electronic package including a second package substrate and a second die, the second package substrate including a second die side and a second interface side, a second contact is located on the second interface side and is electrically coupled to the second die, wherein the metallic plated hole is electrically coupled to the second contact.

In Example 22, the subject matter of Example 21 optionally includes forming contacts of a ball grid array (BGA) on at least one of the first interface side and the second interface side.

In Example 23, the subject matter of any one or more of Examples 21-22 optionally include wherein attaching the first surface of the collective substrate to the first electronic package includes attaching a first electronic package including a stacked die package having a plurality of dies attached together.

In Example 24, the subject matter of Example 23 optionally includes wire bonding the plurality of dies to the first package substrate.

In Example 25, the subject matter of any one or more of Examples 21-24 optionally include forming a plurality of contacts located in a center portion of at least one of the first interface side and the second interface side.

In Example 26, the subject matter of any one or more of Examples 21-25 optionally include wire bonding at least one of the first die and the second die to one of the first die side and the second die side respectively.

In Example 27, the subject matter of any one or more of Examples 21-26 optionally include wherein attaching the first surface of the collective substrate to the first electronic package includes electrically coupling the first contact to the first die through the first package substrate.

In Example 28, the subject matter of any one or more of Examples 21-27 optionally include applying a second package insulative covering on the second die and the second die side to construct the second electronic package.

In Example 29, the subject matter of any one or more of Examples 21-28 optionally include forming a ball grid array (BGA) on the collective substrate.

In Example 30, the subject matter of any one or more of Examples 21-29 optionally include wherein attaching the first surface of the collective substrate to the first electronic package includes attaching the collective substrate to a face of the first electronic package opposing the first package substrate.

In Example 31, the subject matter of any one or more of Examples 21-30 optionally include wherein the first package substrate is wire bonded to the collective substrate.

In Example 32, the subject matter of any one or more of Examples 21-31 optionally include wherein electrically coupling the first package substrate to the collective substrate includes electrically coupling a plurality of contacts of the first package substrate to a plurality of corresponding contacts of the collective substrate.

In Example 33, the subject matter of any one or more of Examples 21-32 optionally include wherein attaching the first surface of the collective substrate to the first electronics package includes bonding the first surface of the collective substrate to the first electronics package with adhesive.

In Example 34, the subject matter of any one or more of Examples 21-33 optionally include forming a plurality of metallic plated holes located in a plurality of apertures, the plurality of metallic plated holes located from the first interface side to the second interface side, wherein the of metallic plated holes are located within a periphery of the first die.

In Example 35, the subject matter of any one or more of Examples 21-34 optionally include wherein forming the metallic plated hole includes forming the metallic plated hole in a location between the first die and the second die.

In Example 36, the subject matter of any one or more of Examples 21-35 optionally include wherein forming the metallic plated hole includes forming the metallic plated hole within a periphery of the second die.

In Example 37, the subject matter of any one or more of Examples 21-36 optionally include wherein forming the metallic plated hole includes forming the metallic plated hole having a dimension along a longitudinal axis of the metallic plated hole that is 10 µm, 500 µm, or any dimension therebetween.

In Example 38, the subject matter of any one or more of Examples 21-37 optionally include wherein forming the metallic plated hole includes forming the metallic plated hole by electrolessly plating the metallic plated hole into the aperture.

In Example 39, the subject matter of any one or more of Examples 21-38 optionally include wherein forming the metallic plated hole includes filling the metallic plated hole with a conductive material.

In Example 40, the subject matter of any one or more of Examples 21-39 optionally include wherein forming the aperture includes laser drilling the aperture from the face to the first interface side.

In Example 41, the subject matter of any one or more of Examples 21-40 optionally include electrically coupling the first package substrate to the collective substrate by wire bonding.

In Example 42, the subject matter of any one or more of Examples 21-41 optionally include wherein electrically coupling the metallic plated hole to the second electronic package includes electrically coupling a plurality of contacts of the second package substrate to a plurality of corresponding contacts of the collective substrate through the first package substrate.

In Example 43, the subject matter of any one or more of Examples 21-42 optionally include wherein electrically coupling the metallic plated hole to the second electronic package includes electrically coupling the first electronic package to the second electronic package for electrical communication between the first electronic package and the second electronic package.

In Example 44, the subject matter of any one or more of Examples 21-43 optionally include electrically coupling the first die and the second die to the collective substrate.

In Example 45, the subject matter of any one or more of Examples 21-44 optionally include wherein electrically coupling the metallic plated hole to the second electronic package includes electrically coupling a second electronic package that is the same size as the first electronic package.

In Example 46, the subject matter of any one or more of Examples 21-45 optionally include wherein electrically coupling the metallic plated hole to the second electronic package includes electrically coupling a second electronic package having a contact pattern that is identical to a contact pattern of the first electronic package.

In Example 47, the subject matter of any one or more of Examples 21-46 optionally include wherein electrically coupling the metallic plated hole to the second electronic package includes electrically coupling a second electronic package including a stacked die package having a plurality of dies attached together.

In Example 48, the subject matter of Example 47 optionally includes electrically coupling the plurality of dies of the second electronic package to the collective substrate through the first package substrate.

Example 49 is a three-dimensional multi-package integrated circuit assembly comprising: a first electronic package including a first package substrate having a first die side and a first interface side, a plurality of first package dies electrically coupled to the first die side of the first package substrate; a second electronic package including a second package substrate having a second die side and a second interface side, a plurality of second package dies electrically coupled to the second die side of the second package substrate; a metallic plated hole electrically coupling the first package substrate and the second package substrate, wherein the metallic plated hole is located from the interface side of the first package substrate to the interface side of the second package substrate; and a collective substrate attached to the first electronic package, wherein the collective substrate is located on a face of the first electronic package opposing the first package substrate, and the collective substrate is electrically coupled to the first package substrate and the second package substrate, and the second package substrate is electrically coupled to the collective substrate through the first package substrate.

In Example 50, the subject matter of Example 49 optionally includes wherein at least one of the first package and the second package includes a plurality of contacts arranged for a ball grid array (BGA).

In Example 51, the subject matter of any one or more of Examples 49-50 optionally include wherein the plurality of second package dies are wire bonded to the second package substrate.

In Example 52, the subject matter of any one or more of Examples 49-51 optionally include wherein the plurality of second package dies are electrically coupled to the collective substrate through the first package substrate.

In Example 53, the subject matter of any one or more of Examples 49-52 optionally include wherein the first electronic package and the second electronic package include a plurality of contacts located in a center portion of the first interface side and the second interface side respectively.

In Example 54, the subject matter of any one or more of Examples 49-53 optionally include wherein the first electronic package and the second electronic package have the same footprint.

In Example 55, the subject matter of any one or more of Examples 49-54 optionally include wherein a contact pattern of the first electronic package and the second electronic package are identical.

In Example 56, the subject matter of any one or more of Examples 49-55 optionally include wherein the plurality of first package dies are wire boded to the first die side.

In Example 57, the subject matter of any one or more of Examples 49-56 optionally include wherein a plurality of contacts of the first package substrate are electrically coupled to a plurality of corresponding contacts of the collective substrate.

In Example 58, the subject matter of any one or more of Examples 49-57 optionally include a first insulative covering over the plurality of first package dies and the first die side and a second insulative covering over the plurality of first package dies and the second die side.

In Example 59, the subject matter of any one or more of Examples 49-58 optionally include a third insulative covering over the first package and a first side of the collective substrate.

In Example 60, the subject matter of any one or more of Examples 49-59 optionally include wherein the metallic plated hole is located within a periphery of the plurality of first package dies.

In Example 61, the subject matter of any one or more of Examples 49-60 optionally include a plurality of metallic plated holes located from the interface side of the first substrate to the interface side of the second substrate, wherein the plurality of metallic plated holes are located within a periphery of the plurality of first package dies.

In Example 62, the subject matter of any one or more of Examples 49-61 optionally include wherein the metallic plated hole is located between the plurality of first package dies and the plurality of second package dies.

In Example 63, the subject matter of any one or more of Examples 49-62 optionally include wherein the metallic plated hole is located within a periphery of the plurality of second package dies.

In Example 64, the subject matter of any one or more of Examples 49-63 optionally include wherein the metallic plated hole includes a dimension along a longitudinal axis of the metallic plated hole that is 10 µm, 500 µm, or any dimension therebetween.

In Example 65, the subject matter of any one or more of Examples 49-64 optionally include wherein the collective substrate is electrically coupled to the first package substrate by wirebonding.

In Example 66, the subject matter of Example 65 optionally includes wherein the collective substrate includes a BGA.

In Example 67, the subject matter of any one or more of Examples 49-66 optionally include wherein the metallic plated hole is electrically coupled to the plurality of first package dies and the plurality of second package dies.

In Example 68, the subject matter of any one or more of Examples 49-67 optionally include wherein the collective substrate is electrically coupled to the plurality of first package dies and the plurality of second package dies through the first package substrate.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first." "second." and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A multi-package integrated circuit assembly comprising:
   a first electronic package including a first package substrate having a first die side and a first interface side opposing the first die side, a first die electrically coupled to the first die side of the first package substrate, the first package substrate including first contact pads exposed on the first die side, second contact pads exposed on the first interface side, and electrical routing layers therein electrically connecting the first contact pads to respective second contact pads;
   a second electronic package including a second package substrate having a second die side and a second interface side opposing the second die side, a second die electrically coupled to the second die side of the second package substrate, the second interface side facing the first interface side, the second package substrate including second contact pads exposed on the second die side, third contact pads exposed on the second interface side, and electrical routing layers therein electrically connecting the third contact pads to respective fourth contact pads;
   a first insulative covering located between the first interface side and the second interface side, the insulative covering disposed on and in contact with the first interface side;
   a metallic plated hole extended through the first insulative covering and electrically coupling the first package substrate and the second package substrate, wherein the metallic plated hole is located from the interface side of the first package substrate to the interface side of the second package substrate;

a conductive interconnect between and in contact with the third contact pads and the metallic plated hole; and a collective substrate attached to the first electronic, wherein the collective substrate is located on a face of the first electronic package opposing the first package substrate, and the collective substrate is electrically coupled to the first die and the second die through the first package substrate, wherein the first insulative covering is disposed on and in contact with a side of the collective substrate outside a periphery of the of first package substrate and facing the first die side.

2. The integrated circuit assembly of claim 1, wherein at least one of the first die and the second die is a stacked die package having a plurality of dies attached together.

3. The integrated circuit assembly of claim 1, wherein the plurality of dies of the second electronic package are electrically coupled to the collective substrate through the first package substrate.

4. The integrated circuit assembly of claim 1, further comprising a second insulative covering located between the first die and the collective substrate and the first die and the first insulative covering.

5. The integrated circuit assembly of claim 1, wherein the metallic plated hole is located within a periphery of the first die.

6. The integrated circuit assembly of claim 1, further comprising a plurality of metallic plated holes located from the interface side of the first substrate to the interface side of the second substrate, wherein the plurality of metallic plated holes are located within a periphery of the first die.

7. The integrated circuit assembly of claim 1, wherein the metallic plated hole is located between the first die and the second die.

8. The integrated circuit assembly of claim 1, wherein the metallic plated hole is located within a periphery of the second die.

9. The integrated circuit assembly of claim 1, wherein the metallic plated hole includes a dimension along a longitudinal axis of the metallic plated hole that is 10 µm, 500 µm, or any dimension therebetween.

10. A three-dimensional multi-package integrated circuit assembly comprising:

a first electronic package including a first package substrate having a first die side and a first interface side, a plurality of first package dies electrically coupled to the first die side of the first package substrate;

a second electronic package including a second package substrate having a second die side and a second interface side, a plurality of second package dies electrically coupled to the second die side of the second package substrate;

a first insulative covering located between the first interface side and the second interface side, the insulative covering disposed on and in contact with the first interface side;

a metallic plated hole extended through the first insulative covering and electrically coupling the first package substrate and the second package substrate, wherein the metallic plated hole is located from the interface side of the first package substrate to the interface side of the second package substrate;

a conductive interconnect between and in contact with the third contact pads and the metallic plated hole; and a collective substrate attached to the first electronic package, wherein the collective substrate is located on a face of the first electronic package opposing the first package substrate, and the collective substrate is electrically coupled to the first package substrate and the second package substrate, and the second package substrate is electrically coupled to the collective substrate through the first package substrate, wherein the first insulative covering is disposed on and in contact with a side of the collective substrate facing the first die side.

11. The integrated circuit assembly of claim 10, wherein the plurality of second package dies are electrically coupled to the collective substrate through the first package substrate.

12. The integrated circuit assembly of claim 10, wherein the metallic plated hole includes a dimension along a longitudinal axis of the metallic plated hole that is 10 µm, 500 µm, or any dimension therebetween.

13. The integrated circuit assembly of claim 10, wherein the collective substrate is electrically coupled to the plurality of first package dies and the plurality of second package dies through the first package substrate.

* * * * *